(12) United States Patent
Okuyama

(10) Patent No.: US 6,760,054 B1
(45) Date of Patent: Jul. 6, 2004

(54) IMAGING APPARATUS UTILIZING LASER BEAMS

(75) Inventor: Takashi Okuyama, Saitama-ken (JP)

(73) Assignee: PENTAX Corporation, Tokyo (JP)

(*) Notice: Subject to any disclaimer, the term of this patent is extended or adjusted under 35 U.S.C. 154(b) by 558 days.

(21) Appl. No.: 09/708,557

(22) Filed: Nov. 9, 2000

(30) Foreign Application Priority Data

Nov. 11, 1999 (JP) .......................................... 11-321003

(51) Int. Cl.[7] .............................................. B41J 2/435
(52) U.S. Cl. .................... 347/234; 250/235; 250/208.1; 250/559.4
(58) Field of Search .......................... 358/474, 1.4, 1.5, 358/505, 510, 513, 497, 496, 1.2, 1.7; 250/235, 208.1; 347/248, 234, 250

(56) References Cited

U.S. PATENT DOCUMENTS

| | | | | |
|---|---|---|---|---|
| 4,920,430 A | * | 4/1990 | Isono et al. .................. | 358/481 |
| 5,046,796 A | * | 9/1991 | Andoh et al. ................ | 359/216 |
| 5,852,293 A | | 12/1998 | Iwasaki et al. .............. | 250/234 |
| 5,980,088 A | | 11/1999 | Iwasaki et al. .............. | 364/474 |
| 6,100,915 A | * | 8/2000 | Iwasaki et al. .............. | 347/249 |
| 6,549,662 B1 | * | 4/2003 | Kobara et al. ............... | 382/185 |

FOREIGN PATENT DOCUMENTS

JP 9-323180 12/1997 ........... B23K/26/00

* cited by examiner

Primary Examiner—Kimberly Williams
Assistant Examiner—Negussie Worku
(74) Attorney, Agent, or Firm—Greenblum & Bernstein, P.L.C.

(57) ABSTRACT

A laser imaging apparatus includes a scanning unit that emits at least one scanning laser beam, which scans on a surface to be scanned in a main scanning direction to form a scanning section. A plurality of position marks formed on the surface are detected to determine the distortion of the surface to be scanned. A calculating system is provided to calculate an inclination of each scanning section with respect the main scanning direction, and a scaling factor of each scanning section with respect to a predetermined length in the main scanning direction based on the shape of the surface to be scanned. Then, when image is formed, the rotational position of the surface to be scanned is changed in accordance with the inclination, and a start position of each scanning section on the surface to be scanned is changed in accordance with the scaling factor.

10 Claims, 7 Drawing Sheets

IMAGING APPARATUS UTILIZING LASER BEAMS

BACKGROUND OF THE INVENTION

The present invention relates to an imaging apparatus utilizing a laser beam or laser beams, and more particularly, to an imaging device that scans an objective surface, on which an image is formed, with the scanning beam(s) modulated in accordance with raster data representing an image to be formed, and simultaneously controls a table on which the objective surface is located to move.

Conventionally, imaging apparatuses utilizing a laser beam are widely used for forming minute patterns on objective surfaces. As a typical example of application of such an imaging apparatus, formation of circuit patterns for a printed circuit board in accordance with a photolithograph method is widely known. A photo resist layer is formed on a base board, on which, the circuit pattern is to be formed. The circuit pattern is designed/edited at the CAD/CAM stations, and then transmitted to an imaging apparatus as vector data. At the imaging device, the vector data of the circuit pattern is converted into raster data. Based on the raster data, and in accordance with a clock pulse having a predetermined frequency, the circuit pattern is formed on the photo resist layer on the base board.

In order to form the printed circuit board at high accuracy, formation of the circuit pattern is performed such that the size and position of the image are adjusted precisely. Assigning of an actual size to the circuit pattern (which is called as a "scaling") is performed at the CAM station, and the adjustment of the position with respect to the objective surface is performed at the imaging apparatus by positioning the objective surface accurately with respect to the scanning beam when the image is formed. However, it is unavoidable that a base board have individual differences depending on the manufacturing conditions and ambient conditions, which result in differences of board size among the base boards. If the size error exceeds an allowable range, the scaling of the circuit pattern should be compensated so as to meet the base board.

In Japanese Patent Provisional Publication HEI 9-323180, an imaging device which compensates for the scaling in order to form an image on a base board which is evenly contracted or expanded in a main or an auxiliary scanning direction is described. In this publication, the size error in a main or an auxiliary scanning direction is compensated using an appropriate clock signal which is generated by gradually shifting a phase of a reference clock pulse. However, if the size of the base board changes unevenly, e.g., the size of the board gradually changes in the main or auxiliary scanning direction, the above-described scaling compensation may not work sufficiently.

SUMMARY OF THE INVENTION

It is therefore an object of the invention to provide an improved laser imaging apparatus which is capable of compensating for the size of an image, e.g., a circuit pattern, in correspondence with a relatively complicated contraction/expansion of an objective surface, on which the image is to be formed.

According to an aspect of the invention, there is provided a laser imaging apparatus, which is provided with a scanning unit that emits at least one scanning laser beam, which scans on a surface to be scanned in a main scanning direction to form a scanning section, the at least one scanning laser beam being modulated in accordance with image data, a moving system that moves the surface to be scanned in an auxiliary scanning direction which is parallel to the surface to be scanned and different from the main scanning direction, a rotating system that rotates the surface to be scanned about a predetermined rotation axis, a detecting system that detects a plurality of position marks formed on the surface to be scanned, a calculating system that calculates an inclination of the scanning section with respect the main scanning direction, and a scaling factor of the scanning section with respect to a predetermined length in the main scanning direction based on a shape of the surface to be scanned, the shape being determined in accordance with the positions of the plurality of position marks, and an adjusting system that adjusts the rotational position of the surface to be scanned in accordance with the inclination, and a start position of the scanning section on the surface to be scanned in accordance with the scaling factor.

Since the rotational position and start position of each scanning section is determined and adjusted, even if the shape of the surface to be scanned is changed gradually, the image can be formed on the surface precisely.

Optionally, the plurality of position marks include four position marks defining a quadrilateral, and the calculating system determines the inclination of the scanning section located at the sides, which are aligned along the auxiliary scanning direction (i.e., extends substantially in the main scanning direction), of the quadrilateral based on the coordinates of the four position marks, the calculating system determining the inclination of the scanning section located between the sides of the quadrilateral by applying a linear approximation to the inclinations of the scanning section located at the sides.

In particular, the four position marks include first and second marks P1, P2 aligned in the main scanning direction, and third and fourth marks P3 and P4 aligned in the main scanning direction, the first and second marks P1 and P2 being spaced from the third and fourth marks P3 and P4 in the auxiliary scanning direction, two-dimensional coordinates of the marks P1, P2, P3 and P4 as detected being defined as (PX1, PY1), (PX2, PY2), (PX3, PY3) and (PX4, PY4), the inclinations of the scanning sections located at the sides of the quadrilateral being expressed as:

$S1=(PX2-PX1)/(PY2-PY1)$; and $SN=(PX4-PX3)/(PY4-PY3)$.

In this case, the surface to be scanned is rotated for each scanning section to compensate for the inclination with respect to the main scanning direction, an imaging start position of each scanning section being compensated in accordance with a distance of the scanning section from the axis of rotation and an angle of rotation.

Still optionally, the plurality of position marks may include four position marks defining a quadrilateral, wherein the calculating system determines the scaling factors of the scanning sections located at the sides, which are aligned along the auxiliary scanning direction, of the quadrilateral based on the coordinates of the four position marks, the calculating system determining the scaling factor of the scanning section located between the sides of the quadrilateral by applying a linear approximation to the scaling factors of the scanning section located at the sides.

In particular, the four position marks include first and second marks P1, P2 aligned in the main scanning direction, and third and fourth marks P3 and P4 aligned in the main scanning direction, the first and second marks P1 and P2 being spaced from the third and fourth marks P3 and P4 in the auxiliary scanning direction, two-dimensional coordinates of the marks P1, P2, P3 and P4 as detected being defined as (PX1, PY1), (PX2, PY2), (PX3, PY3) and (PX4, PY4), two-dimensional coordinates of positions Q1, Q2, Q3 and Q4, which represent designed positions of the four marks P2, P2, P3 and P4, being (QX1, QY1), (QX2, QY2), (QX3, QY3) and (QX4, QY4), the scaling factors T1 and TN of the scanning sections located at the sides of the quadrilateral being expressed as:

$T1=(PY2-PY1)/(QY2-QY1)$; and $TN=(PY4-PY3)/(QY4-QY3)$.

Further optionally, the laser imaging apparatus may include a first table that mounts a member, a surface of which being the surface to be scanned, wherein the rotating system includes a second table that mounts the first table, the first table rotating as the second table rotates, and wherein the moving system includes a third table that mounts the second table, the first and second table moving in the auxiliary scanning direction as the third table moves in the auxiliary scanning direction.

Yet optionally, the auxiliary scanning direction is perpendicular to the main scanning direction.

Further optionally, the detecting system may includes at least one camera system fixed with respect to the imaging apparatus, the camera capturing an image of the plurality of position marks, and an image processing system that processes the image captured by the at least one camera and determines two-dimensional coordinates of the plurality of position marks.

Furthermore, the scanning unit may be constituted to emit a plurality of laser beams parallel to each other, and aligned in the auxiliary scanning direction.

BRIEF DESCRIPTION OF THE ACCOMPANYING DRAWINGS

Figure 4:
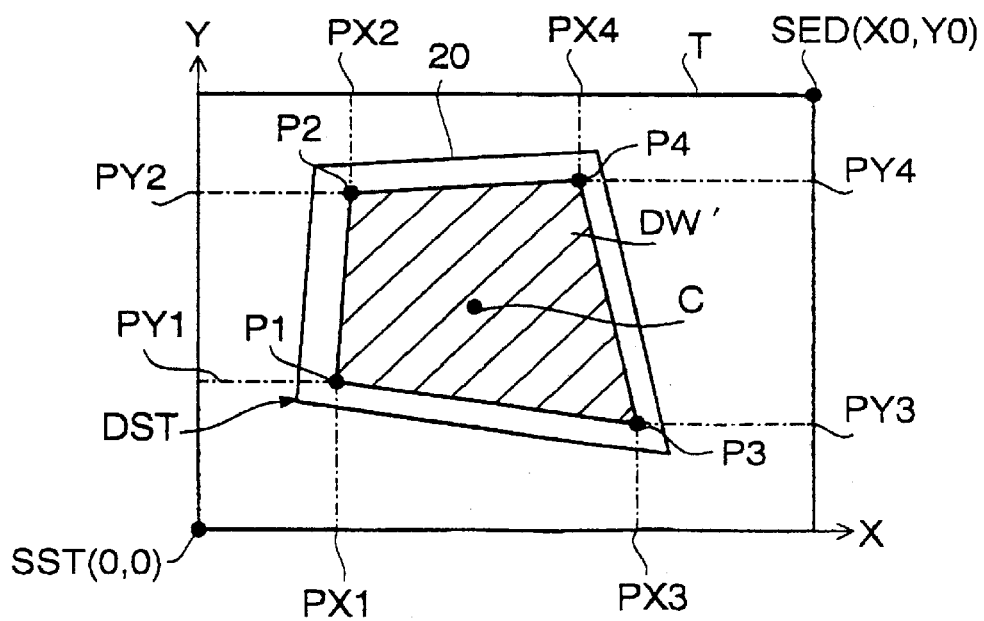
Figure 5A:
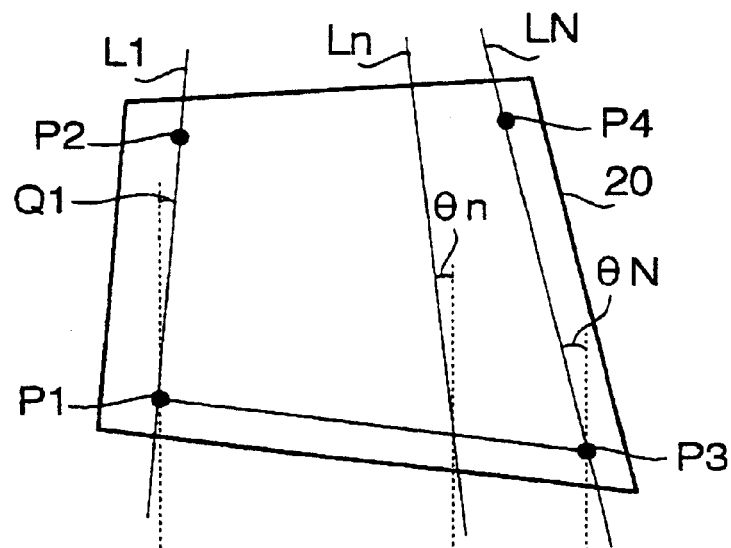
Figure 5B:
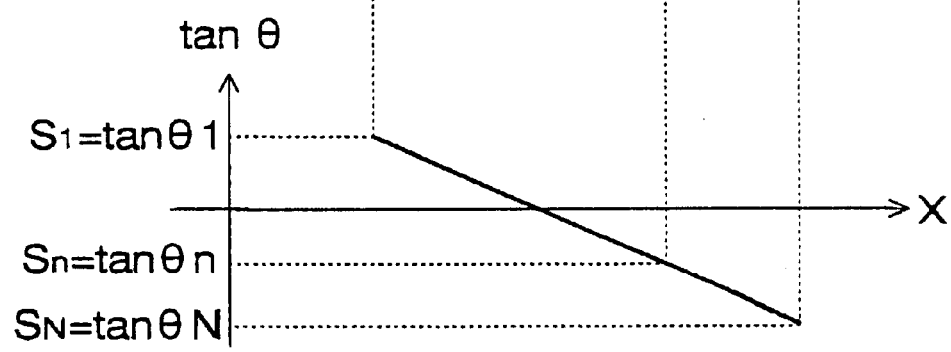
Figure 6A:
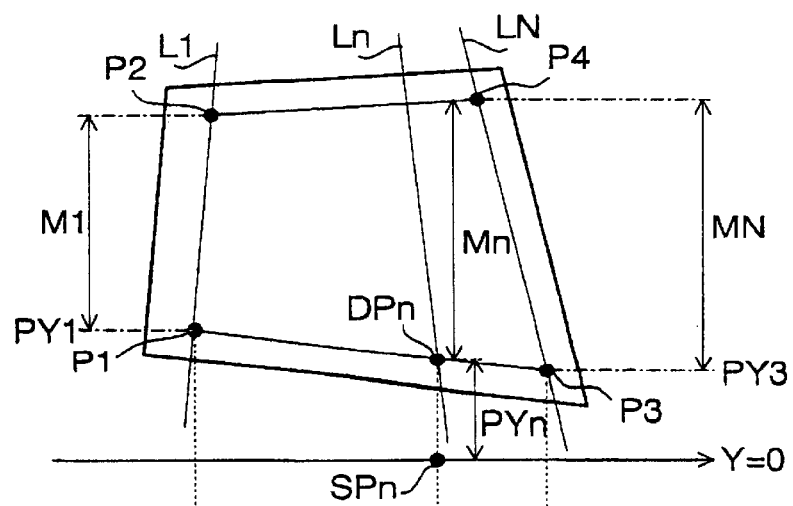
Figure 6B:
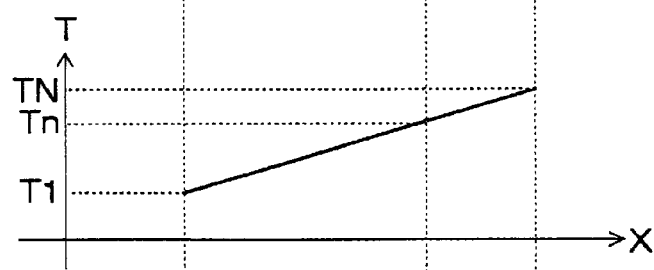
Figure 6C:
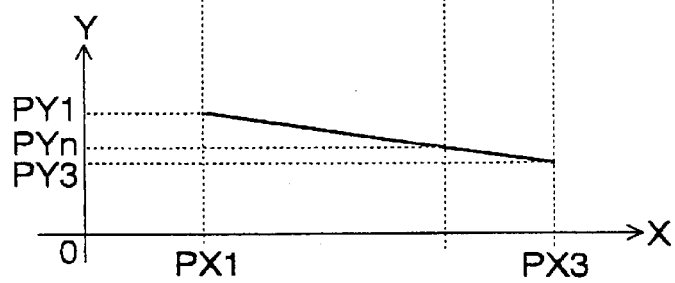
Figure 7A:
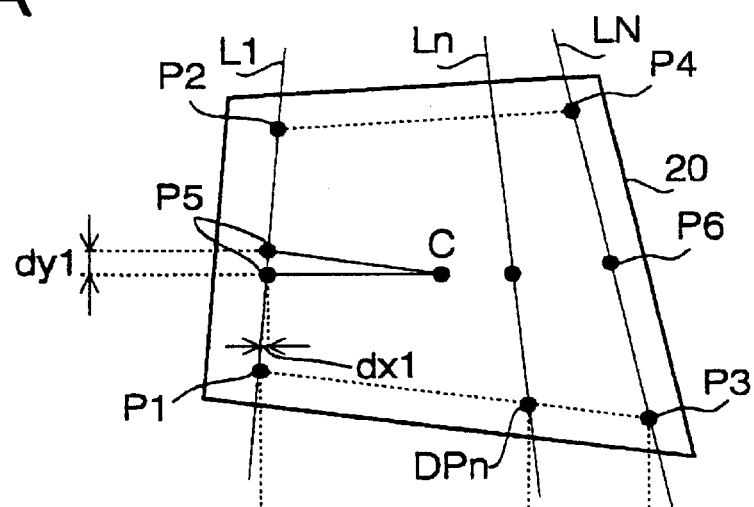
Figure 7B:
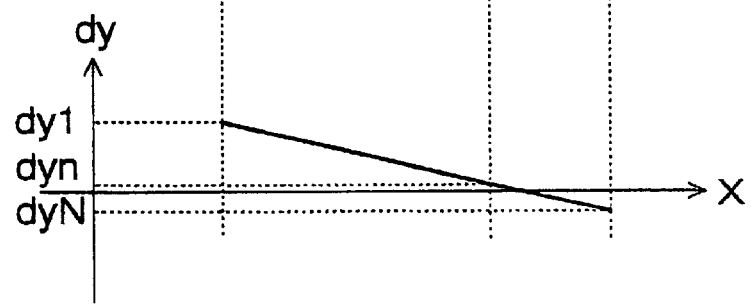

FIG. 4 schematically shows the shape of a base board on which an image is formed;

FIGS. 5A and 5B illustrate an inclination of a main scanning line which is inclined with respect to the base board shown in FIG. 4;

FIGS. 6A–6C illustrate contraction/expansion of a scanning line;

FIGS. 7A and 7B illustrate error when a base board is rotated to compensate for an inclination of the base board shown in FIGS. 5A and 5B; and.

Figure 1:
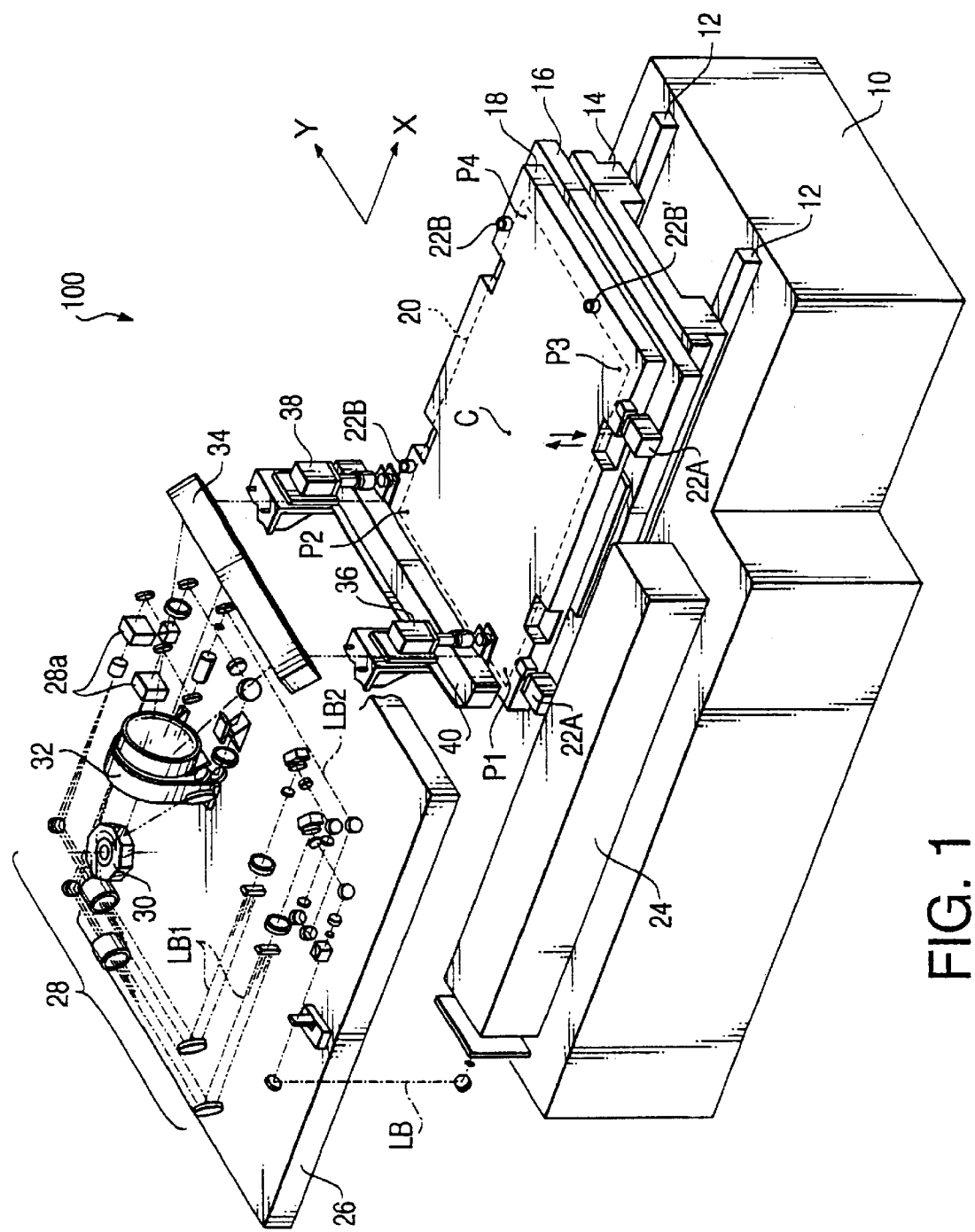
FIG. 1 is a perspective view schematically showing a structure of a laser imaging apparatus according to an embodiment of the invention.
Figure 8:
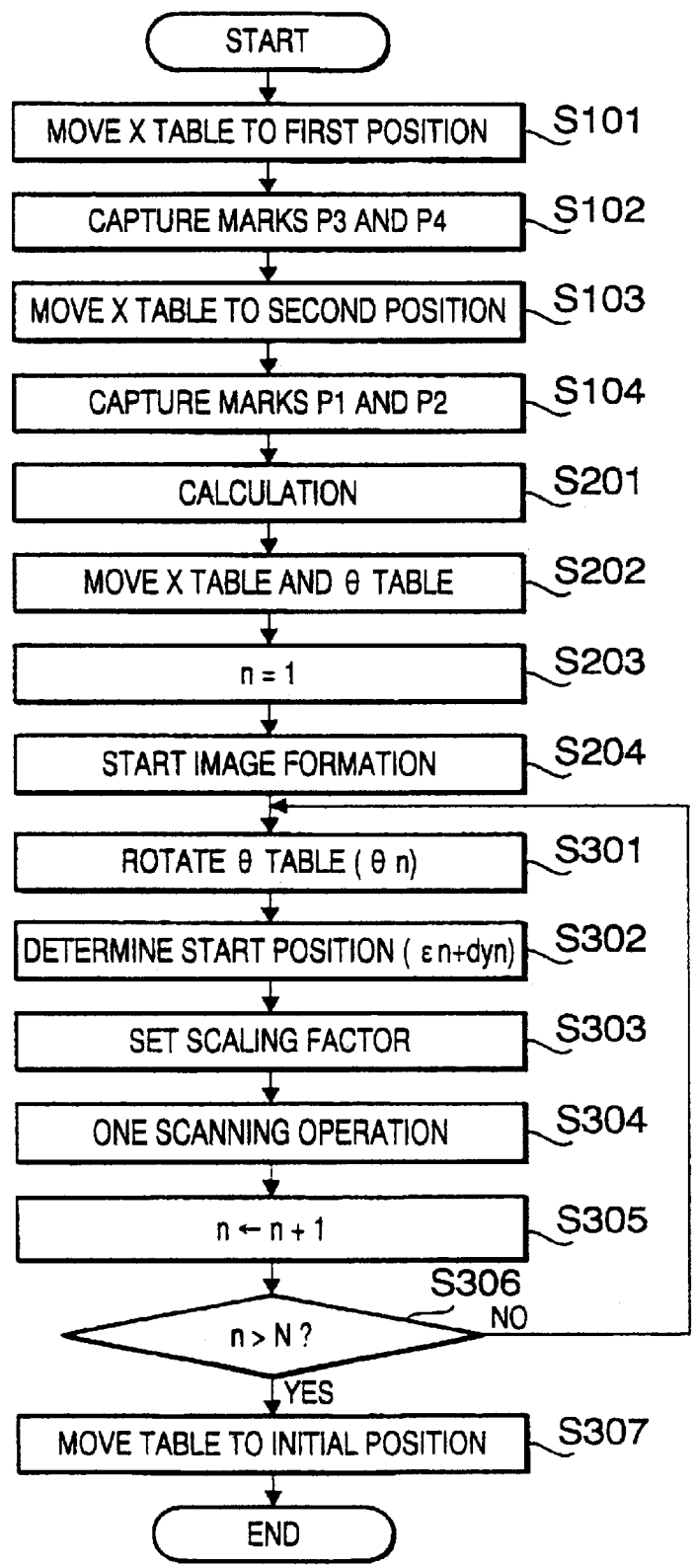

FIG. 8 is a flowchart illustrating an imaging procedure of the laser imaging apparatus shown in FIG. 1.

DESCRIPTION OF THE EMBODIMENT

Referring to the accompanying drawings, an imaging apparatus according to an embodiment of the present invention will be described.

FIG. 1 is a perspective view of the laser imaging apparatus 100 according to an embodiment of the present invention. The laser imaging device 100 forms an image of a circuit pattern on a photo resist layer provided on a base board 20 to form a printed circuit board in accordance with a photolithograph method.

The laser imaging apparatus 100 is provided with a base 10. On an upper surface of the base 10 a pair of rails 12 are arranged extending in a longitudinal direction of the base 10 (i.e., in X-axis direction). On the rails 12, an X table 14 is slidably mounted such that the X table 14 is slidably in the X-axis direction. The X table 14 mounts an imaging table 18 via a θ table 16. The θ table 16 is rotatable, with respect to the X table 16, about an axis C. As the θ table 16 rotates, the imaging table 18 rotates accordingly.

On the imaging table 18, a base board 20 is placed The base board 20 is formed with a photo resist layer, on which an image of a circuit pattern is to be formed. The base board 20 is conveyed by a belt conveyer or the like (not shown) to the imaging table 18, and aligned at a predetermined position by positioning mechanisms including biasing mechanisms 22A and positioning pins 22B and 22B'. That is, the biasing mechanisms 22A urges one longer side of the base board 20 in Y-axis direction so that the opposite side of the base board 20 contacts the positioning pins 22B. Further, another biasing mechanism (not shown) urges one shorter side of the base board 20 in X-axis direction so that the opposite side of the base board 20 contacts the positioning pint 22B'. The base board 20 is indicated by broken lines in FIG. 1. Above the imaging table 18, a base plate 26 of a light emitting station is provided substantially in parallel with the surface of the imaging table 18. On the base plate 26, various optical elements 28 for directing a laser beam LB emitted by a laser emitting device 24 toward the imaging table 18 are arranged.

Since the optical elements 28 are well-known, description thereof is omitted. However, it should benoted that a laser beam LB is divided into two sets of laser beams LB1 and LB1, each including eight beams parallel to each other, and each set of eight beams LB1 and LB1 are modulated by electronic shutters 28a in accordance with raster data representing a certain circuit pattern to be formed on the base board 20. The electronic shutters 28a are controlled in accordance with a clock signal having a predetermined frequency.

The two sets of eight beams LB1 and LB1 are combined to bealigned, and deflected by reflective side surfaces of a polygonal mirror 30. The deflected beams LB1 and LB1 are incident on the imaging table 18 via an fθ lens 32 and a turning mirror 34. With this configuration, the surface of the photo resist layer of the base board 20 is exposed to the sixteen scanning beams LB1 in the Y-axis direction (which will also be referred as a main scanning direction). A line, which extends in the Y-axis direction, of the surface of the photo resist layer scanned by one beam at one scanning will be referred to as a scanning line. Further, an area of the surface of the photo resist layer scanned by the set of sixteen beams LB1 and LB1 at one scanning will be referred to as a scanning section.

At one scanning operation, sixteen scanning lines aligned in the X-axis direction are formed simultaneously. While the main scanning is performed, the X table 14 is driven to move in the X-axis (which will be referred to as an auxiliary scanning direction) along the rails 12. For one scanning operation, the X table 14 moves by an amount corresponding to the length of a scanning section in the auxiliary scanning direction, i.e., the length of the sixteen scanning lines. With this control, a two-dimensional pattern (i.e., a circuit pattern) is formed on the photo resist layer on the base board 20. If the X-axis and Y-axis forms a right angle, since the base board 20 moves during the scanning operation, each scanning line does not form a right angle with respect to the X-axis. Practically, the main scanning direction is slightly inclined with respect to the Y-axis so that the scanning lines as formed are perpendicular to the X-axis.

As shown in FIG. 1, two CCD cameras 36 and 38 are aligned along the Y-axis direction, and fixed above the imaging table 18. The optical systems of the CCD cameras 36 and 38 are arranged to receive light from the imaging table 18. Each of the CCD cameras 36 and 38 is a small-sized camera utilizing a CCD. The CCD cameras 36 and 38 are used to capture position marks P1, P2, P3 and P4 formed on the base board 20 in order to determine a relative position of the base board 20 with respect to the imaging apparatus 100.

Below the CCD cameras 36 and 38, a Y-linear scale 40, which extends in the Y-axis direction, is provided integrally with the CCD cameras 36 and 38. On the base 10, an X-linear scale 42 (see FIG. 2), which extends in the X-axis direction, is provided. The linear scales 40 and 42 are used for detecting a position of a deflected monitor beam LB2 (which will be described later), and a relative position of the imaging table 18 (i.e., the amount of movement and rotation) with respect to the base 10.

Figure 2:
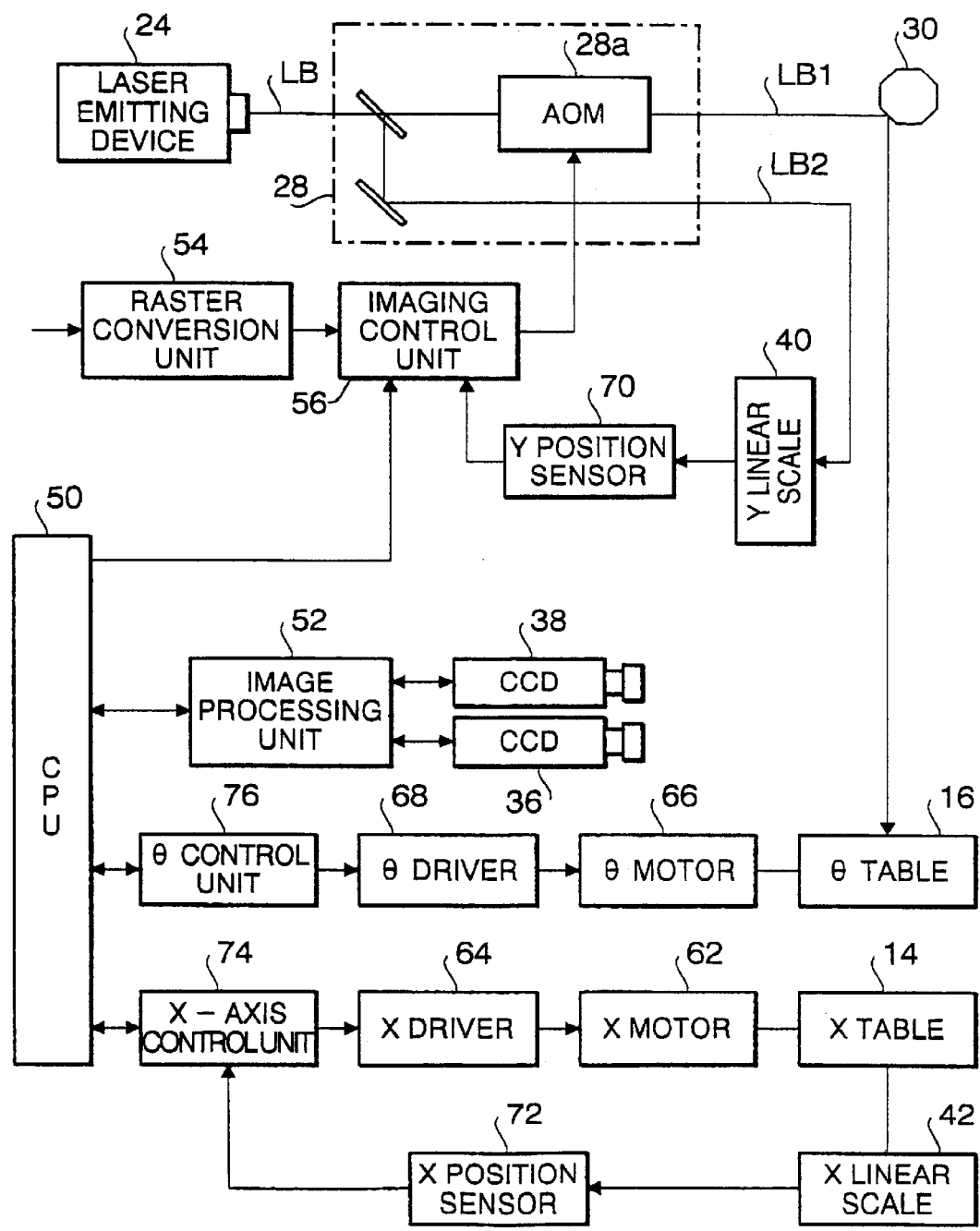
FIG. 2 is a block diagram showing a configuration of the laser imaging apparatus shown in FIG. 1.

FIG. 2 shows a block diagram of a control system of the imaging apparatus 100 shown in FIG. 1. The imaging apparatus 100 includes a CPU 50 that controls the entire system of the imaging apparatus 100.

As shown in FIG. 2, the CCD cameras 36 and 38 are connected to the CPU 50 through an image processing unit 52. When a scanning operation is performed, initially, the position marks P1–P4 are read using the CCD cameras 36 and 38. The image signals representing the captured position marks P1–P4 are processed by the image processing unit 52 and transmitted to the CPU 50.

Image data of a circuit pattern is created/edited at, for example, the CAD and/or CAM stations (not shown), and transmitted to the imaging apparatus 100 as vector data. When an image is formed, the image data (i.e., the vector data) is converted into raster data at a raster conversion unit 54, and then transmitted to an imaging control unit 56. The imaging control unit 56 is connected with an electronic shutter 28a, which is included in the optical elements 28. Specifically, the electronic shutter 28a includes sixteen AOMs (acousto-optic modulators) corresponding to the sixteen beams LB1, respectively. The AOMs are used for modulating the beams LB1 respectively in accordance with the raster data representing the circuit pattern.

The imaging control unit 56 includes a memory that is capable of storing the raster data for at least sixteen scanning lines (i.e., one scanning section), and changes driving voltages for the AOMs in the electronic shutter unit 28a in accordance with the raster data. For example, if a data value of a pixel in the raster data represents "1", an AOM is driven such that a laser beam incident on the AOM is diffracted to proceed toward the polygonal mirror 30, and if the data value of a pixel is "0", an AOM is driven such that a laser beam incident on the AOM is diffracted to proceed not to the polygonal mirror 30. In such a case, on the baseboard 20, only portions corresponding to the raster data whose pixel values are "1" are exposed to the beams LB1. With this control, a desired circuit pattern is formed on the base board 20.

The X table 14 is driven to move in the X-axis direction by an X motor 62, which is a servo motor, a stepping motor or the like. The movement of the X motor 62 is controlled by an X driver 64. The X driver 64 is controlled by an X-axis control unit 74, which outputs a driving signal to the X driver 64 in accordance with a command signal transmitted by the CPU 50. The movement of the imaging table 18 in the X-axis direction (i.e., the movement of the X table 14 in the X-axis direction) is detected by an X position sensor 72, which detects a moving amount of the imaging table 18, in the X-axis direction, in accordance with the output signal of the X linear scale 42. The detection results of the X position sensor 72 is fed back to the X-axis control unit 74, which outputs a driving signal in accordance with the command signal transmitted by the CPU 50 and the signal output by the X linear scale 42. Thus, the movement of the X table 14 is feedback-controlled.

The θ table 16 is rotated about the center C by a θ motor 66, which is controlled by a θ driver 68. A θ control unit 76 outputs a driving signal to the θ driver 68 in accordance with a command signal output by the CPU 50. A part of the laser beam LB emitted by the laser emitting device 24 is separated, by a beam splitter implemented in the optical system 28, as a monitor beam LB2 (see FIG. 1). The monitor beam LB2 is directed to the Y linear scale 40. A Y position sensor 70 receives a signal from the Y linear scale 40, detects the position of the monitor beam LB2 along the Y-axis, and outputs a signal representing the position of the incident beam LB2 along the Y-axis. The output signal of the Y position sensor 70 is processed and input to the imaging control unit 56. The imaging control unit 56 controls the AOMs 28a in accordance with the raster data and the position of the beams along the Y-axis, which is represented by the signal transmitted by the Y position sensor 70.

The CPU 50 calculates two-dimensional coordinates of the position marks P1–P4 based on the image signals obtained by the CCD cameras 36 and 3B, and the detection result of the X position sensor 72. Based on the coordinates, a position of the base board 20 with respect to the imaging table 18 is determined. Further, by comparing the coordinates with reference coordinates, which represent the designed coordinates, deviation of the size of the base board 20 is detected.

Firstly, a principle of the present invention will be described. The laser imaging apparatus 100 utilizes sixteen beams for image formation as described, and the image formation is performed on imaging section basis (i.e., sixteen scanning lines are formed at the same time). In the following description regarding the principle of the compensation with reference to FIGS. 3–7B, only a single scanning line of the sixteen beams is referred to. In the laser imaging apparatus 100, the same compensation applies to the scanning lines in the same scanning section.

Figure 3:
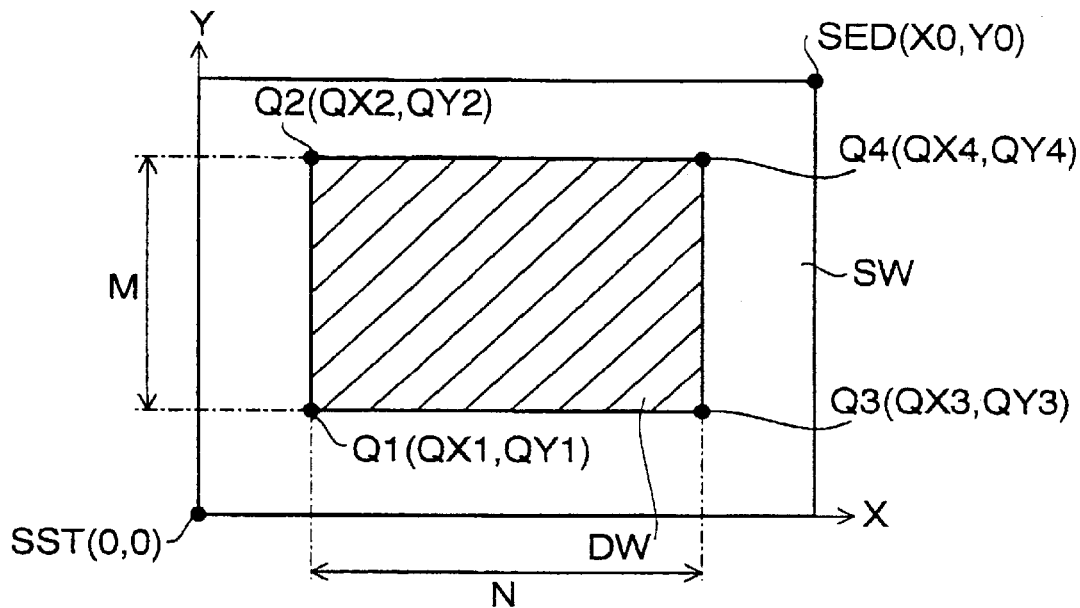
FIG. 3 is a conceptual diagram illustrating a data structure of a circuit pattern to be formed on a base board.

FIG. 3 is a conceptual diagram illustrating data of a circuit pattern (which will be referred to as pattern data hereinafter) as designed. The pattern data is generated with respect to a rectangular area (a scanning area) SW. The scanning area SW is defined by a scanning start point SST and a scanning end point SED, which are diagonally opposite points. In FIG. 3, the X and Y coordinates of each point are indicated in parentheses. The scanning start point SST is indicated as an origin point whose coordinates are (0, 0), and the coordinates of the scanning end point SED are (X0, Y0).

An image forming area DW is defined inside the scanning area SW. The image forming area DW is a rectangular area defined by a start point Q1 (QX1, QY1) and an end point Q4 (QX4, QY4), which are diagonally opposite points. The position marks P1–P4 formed on the base board 20 respectively correspond to points Q1–Q4 of the data structure shown in FIG. 3. As shown in FIG. 3, the coordinates of point Q2 are (QX2, QY2) and those of point Q3 are (QX3, QY3).

If the coordinates of position marks P1–P4 read by the CCD cameras 36 and 38 coincide with the coordinates of points Q1–Q4, respectively, the imaging apparatus 100 starts scanning from a point whose Y coordinate is zero, and form an image from a point whose Y coordinate is QY3 and length is M (=QY2–QY1). To cover the entire area DW, the scanning in the Y-axis direction is to be repeated N times (i.e., N scanning lines are formed within the area DW.

FIG. 4 schematically shows the base board 20 placed on the imaging table 18. It should be noted that the base board 20 is drawn as distorted, and the distortion is exaggerated in the drawing for the purpose of explanation. As shown in FIG. 4, the base board 20 is shaped such that a length of the base board 20 in the Y-axis direction is longer in the right-hand side, and a length of the base board 20 in the X-axis direction is shorted in the upper side in the drawing. In FIG. 4, an imaging start point is indicated as DST. The coordinates of position marks P1–P4 are (PX1, PY1), (PX2, PY2), (PX3, PY3) and (PX4, PY4), respectively. An imaging area DW' is a quadrilateral defined by the position marks P1–P4.

When the base board 20 is distorted as shown in FIG. 4, the image formation is performed such that an image is formed on the imaging area DW' based on the data for the designed imaging area DW (see FIG. 3). For this purpose, the distortion of the base board 20 is divided into two axial components (i.e., in the X-axis and Y-axis directions), and the image formation is performed with rotating the imaging table 18 (i.e., inclining the scanning lines with respect to the Y-axis) to adjust the image to meet the distortion in the X-axis direction (X-axis component), and contracting/expanding the length M (i.e., changing a scaling factor) of each scanning line to adjust the image to meet the distortion in the Y-axis direction (Y-axis component).

Referring to FIGS. 5A and 5B, the adjustment of the image to meet the distortion in the X-axis direction will be described.

In FIG. 5A, inclination of each of the scanning lines L1, . . . Ln and LN with respect to the Y-axis is indicated. The first scanning line L1, which passes the position marks P1 and P2, is inclined with respect to the Y-axis by θ1. Therefore the inclination S1 is calculated by formula (1). Similarly, the inclination SN of the N-th scanning line LN passing marks P3 and P4 is calculated by formula (2).

$$S1=\tan\theta1=(PX2-PX1)/(PY2-PY1) \quad (1)$$

$$SN=\tan\theta N=(PX4-PX3)/(PY4-PY3) \quad (2)$$

As shown in FIG. 5B, it is assumed that the inclination of the scanning line changes from tan θ1 to tan θN proportionally to the X coordinate. Therefore, for an arbitrary n (1≦n≦N), the inclination Sn of an n-th scanning line is expressed by formula (3).

$$Sn=\tan\theta n=(SN-S1)\cdot n/N+S1 \quad (3)$$

By rotating the imaging table 18 by the amount Sn about the axis C in a X-Y plane for the n-th scanning line Ln, the data for the imaging area DW (see FIG. 3) is transferred to the imaging area DW' (FIG. 4) of the base board 20, and thus the distortion in the X-axis direction is compensated. For example, with respect to the first scanning line L1, the imaging table 18 is rotated counterclockwise by θ1 about the axis C, and for the N-th scanning line LN, the imaging table 18 is rotated clockwise by θN about the axis C when the image is formed.

Next, the compensation in the Y-axis direction will be described-referring to FIGS. 6A–6C.

In FIG. 6A, starting point and the scaling factor of each of the scanning lines L1, . . . Ln and LN is indicated. If the length of first scanning line L1 is represented by Ml, a scaling factor T1 of the scanning line L1 with respect to the length M of the designed scanning line is obtained by formula (4). Similarly, the scaling factor TM of the N-th scanning line LN is calculated by formula (5).

$$T1=M1/M=(PY2-PY1)/(QY2-QY1) \quad (4)$$

$$TN=MN/M=(PY4-PY3)/(QY4-QY3) \quad (5)$$

As shown in FIG. 6B, it is assumed that the scaling factor of the scanning line changes from T1 to TN proportionally to the X-coordinate. Therefore, for an arbitrary n (1≦n≦N), the scaling factor Tn of an n-th scanning line Ln is expressed by formula (6).

$$Tn=(TN-T1)\cdot n/N+T1 \quad (6)$$

By multiplying the design length M by the scaling factor Tn, the length Mn of the n-th scanning line Ln is obtained. Thus, the shape of the image in the Y-axis direction is adjusted.

The expansion of the length Mn of the scanning line Ln is achieved by shifting the phase of the clock pulse signal, which determines the modulating timing of the laser beams, in the positive or negative direction at every predetermined interval, making the shift amount substantially coincide with the difference of the line length Mn with respect to the designed line length M.

That is, for example, one scanning line of the raster data includes 100 thousand pixels, which are assigned within the imaging area DW whose length in the Y-axis direction is 500 mm (i.e., the size of one pixel is 5 μm). Further, the phase of the clock pulse can be shifted in ten steps, and the minimum shiftable amount is 0.5 (=5/10) μm In such a case, if the length of the base board 20 expands by 1 mm in the main scanning direction to becomes 501 mm, the pixels may be shifted such that a pitch is greater by 0.5 μm at every 50 pixels within a range of 501 mm as even as possible. By this shift, the length of the scanning line can be expanded by 1 mm (which corresponds to 200 pixels) in the main scanning direction. The phase of the clock pulse is shifted by switching ten clock pulses, which have the same frequency and the phases are shifted by 1/10 of the period. Such a switching operation is performed by the CPU 50.

It should be noted, however, the distortion in the Y-axis direction cannot be compensated only by adjusting the length Mn of the scanning line Ln. The image formation start point of each scanning line changes depending on the shape of the base board 20. For example, in FIG. 6A, the start point of each scanning line is on a line segment that connects position marks. P1 and P3. As shown in FIG. 6C, the Y coordinate of the start point decreases at right-hand side. Further, in accordance with the contraction/expansion of the length Mn of a scanning line Ln, a distance between the scanning start point and the image formation start point is also contracted/expanded. Therefore, if the scanning is started from a point whose Y coordinate is zero for every line, the image formation start point may be shifted. Accordingly, in the embodiment, the scanning start point for each line is compensated in accordance with the scaling factor so that the image formation area fits the shape of the base board 20.

For an n-th scanning line Ln, a distance PYn between the scanning start point SPn and the image formation start point DPn is obtained by formula (7).

$$PYn = (PY3 - PY1) \cdot n/N + PY1 \quad (7)$$

The designed image formation start point taking the scaling factor Tn into account is QY1·Tn (=QY3·Tn). When QY1=QY3=QY, an error εn between the designed image formation point and the Y coordinate of the actual image formation start point DPn is obtained by formula (8).

$$\epsilon n = PYn - QY \cdot Tn \quad (8)$$

Therefore, by shifting the scanning start point SPn by εn from the point where Y=0 in the Y-axis direction, the image formation start point DPn can be located at a position corresponding to the shape of the base board 20. The error εn will be referred to as a displacement of the scanning start point.

As described above, by shifting the scanning start position SPn and compensating for the length Mn of the scanning line in accordance with the scaling factor Tn in the n-th scanning line, each scanning line is appropriately modified in accordance with the distortion in the Y-axis direction so that the imaging area DW is converted to fit the shape of the base board 20. It should be noted that the CPU 50 generates the scanning start command signal in the main scanning direction based on the displacement amount εn. The scanning start command signal is output to the imaging control unit 56. Thus, the scanning start position of the laser beam in the main scanning direction is shifted depending on the error εn.

In summary, for each scanning line, by rotating the imaging table 18 by means of the θ table 16, and controlling the scanning start position and the length of the scanning line, the data for the imaging area DW is made correspond to the imaging area DW' of the base board 20.

The above described displacement amount εn is obtained without taking the rotation of the table 18 into account. Therefore, a further compensation as described below should be performed.

FIGS. 7A and 7B show the error when the base board 20 is rotated for adjusting the image in the X-axis direction.

Firstly, the compensation for a displacement amount ε1 of the scanning start point of the first scanning line L1 is described.

In order to adjust the inclination S1 obtained from formula (1), the base board 20 is rotated by θ1 using the θ table 16 so as to cancel the inclination S1. In this case, a displacement amounts in the Y-axis direction and in the X-axis direction of a central point P5 between the position marks P1 and P2 are represented by dy1 and dx1, these values are obtained in accordance with formulae (9) and (10).

$$dx1 = \left\{ \frac{(PX1 + PX2)}{2} - CX \right\} \cdot (1 - \cos\theta 1) \quad (9)$$

$$dy1 = \left\{ \frac{(PX1 + PX2)}{2} - CX \right\} \cdot \sin\theta 1 \quad (10)$$

where, CX is an X coordinate of the axis C, about which the θ table rotates. Since θ1 is very small, cos θ1 is regarded as one, substantially, and sin θ1 is regarded as S1 (=tan θ1) substantially. Therefore, the displacement amounts dx1 and dy1 are approximated as formulae (11) and, (12).

$$dx1 = 0 \quad (11)$$

$$dy1 = \left\{ \frac{(PX1 + PX2)}{2} - CX \right\} \cdot S1 \quad (12)$$

As above, the rotation of the imaging table 18 affects only the displacement amount dy1 in the Y-axis direction, substantially. In the embodiment, the displacement amount dy1 is added to the displacement amount εn of the scanning start point, thereby the scanning start point of the first scanning line L1 being compensated. That is, the scanning start point of the first scanning line L1 is shifted, with respect to a point where Y=0, in the Y-axis direction by (ε1+dy1).

For the N-th scanning line, the approximated displacement amount dyN of the central point P6 between the position marks P3 and P4 is obtained by formula (13).

$$dyN = \left\{ \frac{(PX3 + PX4)}{2} - CX \right\} \cdot SN \quad (13)$$

By assuming that the displacement amount in the Y-axis direction linearly changes from dy1 to dyN as the X coordinate changes, as shown in FIG. 7B, the displacement amount dyn for the n-th scanning line is obtained by formula (14).

$$dyn = (dyN - dy1) \cdot \frac{n}{N} + dy1 \quad (14)$$

As above, the scanning start point of the n-th scanning line Ln is a point which is shifted from a point where Y=0 by (εn+dyn) in the Y-axis direction.

As described above, the CPU 50 calculates the scaling factor in the Y-axis direction of each scanning line and inclination of the base board 20 with respect to the Y-axis in accordance with a linear approximation with reference to positioning marks P1–P4. Then, in accordance with the scaling factor and inclination, the CPU 50 determines the image formation start point and amounts for the rotational position and the length of the scanning line for each scanning line. Then, based on the determined parameters, the CPU 50 controls the X-axis control unit 74 and θ control unit 76 to drive the X table 14 and the θ table 16. Further, the CPU 50 controls the imaging control unit 56, to adjust the timing of the image formation.

In the above-described embodiment, the size of the base board 20 is detected, and the distortion of the base board 20 is divided into X component and Y component. Then, the image to be formed on the base board 20 is compensated to fit the actual shape of the base board 20. Regarding the distortion in the Y-axis direction, the image formation start point and the length of the scanning line are adjusted, and regarding the distortion in the X-axis direction, the inclination of the scanning line with respect to the Y-axis is adjusted. Since a position of each pixel of the image is compensated on a real-time basis, the image (i.e., the circuit pattern) can be precisely formed in correspondence with the distortion of the base board 20.

When the above-described principle applies to the imaging apparatus 100 that forms sixteen scanning lines simultaneously, the compensation amount is calculated for every sixteen scanning lines, and the sixteen scanning included in the same scanning section are compensated by the same amount. That is, since the sixteen scanning lines are formed simultaneously, the calculated parameters are used for all the sixteen beams, which are scanned at one scanning operation. It should be noted that when the compensation amount is calculated for N scanning lines (i.e., there are N scanning sections), and the scanning section includes sixteen scanning lines, an image is formed with N×16 scanning lines.

FIG. 8 shows a flowchart illustrating an image forming procedure executed by the CPU 50. The image forming procedure is executed after the base board 20 is placed on the imaging table 18.

At S101, the X table 14 is moved to a first measurement position, at which the marks P3 and P4 are viewed within fields of view of the CCD cameras 36 and 38, respectively.

At S102, the CCD cameras 36 and 38 are driven to capture images, respectively. Then, the CPU 50 determines the central coordinates of the marks P3 (PX3, PY3) and P4 (PX4, PY4) from the captured images.

At S103, the X table 14 is moved to a second measurement position, at which the marks P1 and P2 are viewed within the fields of view of the CCD cameras 36 and 38, respectively. Then, at S104, the CCD cameras 36 and 38 are driven to capture images, respectively. Next, the CPU 50 determines the central coordinates of the marks P1 (PX1, PY1) and P2 (PX2, PY2) from the captured images.

At S201, inclination S, scaling factor T, compensation amount ($\epsilon$+dy) of the scanning start point for each of the N scanning sections are calculated. Further, preparation for image formation such as warming up of the laser emitting device 24 is executed. Then, at S202, the X table 14 and $\theta$ table 16 are driven so that the imaging table 18, and therefore the base board 20 is located at an image formation start position. At S203, a counter n is set to an initial value, i.e., one (1). Then, at S204, the CPU 50 starts forming an image on the base board 20.

Steps. S301–S306 are repeated until the counter n exceeds the number N of the scanning sections.

At S301, for an n-th scanning line, the $\theta$ table 16 is rotated by $\theta$ n which has been determined based+on the inclination Sn. Then, based on the compensation amount ($\epsilon$n+dyn), a scanning start position, that is, the timing at which the scanning starts is determined at S302. At S303, based on the scaling factor Tn, the frequency of the clock pulse is determined. Then, at S304, one scanning operation is executed in accordance with the parameters determined at steps S302 and S303.

When S304 is finished, the counter n is incremented by one, and it is determined whether the counter n exceeds the total number N of the scanning sections. If the counter n is equal to or smaller than the number N, the procedure at S301–S306 is repeated. If the counter n is greater than the number N, the imaging table 18 is moved to the initial position (S307), and the image formation procedure is terminated.

In the embodiments, the imaging apparatus simultaneously forms, a plurality of scanning lines at each scanning operation. However, the invention is not limited to such a configuration, and the invention is applicable to an imaging apparatus forming only a single scanning line at each scanning operation.

The present disclosure relates to the subject matter contained in Japanese Patent Application No. HEI 11-321003, filed on Nov. 11, 1999, which is expressly incorporated herein by reference in its entirety.

What is claimed is:

1. A laser imaging apparatus, comprising:

a scanning unit that emits at least one scanning laser beam, which scans a surface to be scanned in a main scanning direction to form a scanning section, the at least one scanning laser beam being modulated in accordance with image data;

a mover that moves the surface to be scanned in an auxiliary scanning direction, which is parallel to the surface to be scanned and different from the main scanning direction;

a rotator that rotates the surface to be scanned about a predetermined rotation axis;

a detector that detects a plurality of position marks provided on the surface to be scanned;

a calculator that calculates an inclination of said scanning section with respect the main scanning direction, and that calculates a scaling factor of said scanning section with respect to a predetermined length in the main scanning direction based on a shape of the surface to be scanned, the shape being determined in accordance with the positions of said plurality of position marks; and an adjuster that adjusts a rotational position of the surface to be scanned in accordance with the inclination, and adjusts a start position of said scanning section on the surface to be scanned in accordance with said scaling factor.

2. The laser imaging apparatus according to claim 1, wherein said plurality of position marks includes four position marks defining a quadrilateral, wherein said calculator determines the inclination of said scanning section located at the sides that are aligned along the main scanning direction of said quadrilateral based on coordinates of said four position marks, said calculator determining the inclination of the scanning section located between the sides of said quadrilateral by applying a linear approximation to said inclinations of said scanning section located at the sides.

3. The laser imaging apparatus according to claim 2, wherein said four position marks include first and second marks P1, P2 aligned in the main scanning direction, and third and fourth marks P3 and P4 aligned in the main scanning direction, said first and second marks P1 and P2 being spaced from said third and fourth marks P3 and P4 in the auxiliary scanning direction, two-dimensional coordinates of said marks P1, P2, P3 and P4 as detected being defined as (PX1, PY1), (PX2, PY2), (PX3, PY3) and (PX4, PY4), the inclinations S1 and SN of said scanning sections located at the sides of said quadrilateral being expressed as:

$$S1=(PX-PX1)/(PY2-PY1); \text{ and}$$

$$SN=(PX4-PX3)/(PY4-PY3).$$

4. The laser imaging apparatus according to claim 3, wherein said surface to be scanned is rotated for each scanning section to compensate for the inclination with respect to the main scanning direction, an imaging start position of each scanning section being compensated in accordance with a distance of the scanning section from the axis of rotation and an angle of rotation.

5. The laser imaging apparatus according to claim 1, wherein said plurality of position marks include four position marks defining a quadrilateral, wherein said calculator determines the scaling factors of said scanning sections located at the sides that are aligned along the main scanning direction of said quadrilateral based on coordinates of said four position marks, said calculator determining the scaling factor of the scanning section located between the sides of said quadrilateral by applying a linear approximation to said scaling factors of said scanning section located at the sides.

6. The laser imaging apparatus according to claim 5, wherein said four position marks include first and second marks P1, P2 aligned in the main scanning direction, and third and fourth marks P3 and P4 aligned in the main scanning direction, said first and second marks P1 and P2 being spaced from said third and fourth marks P3 and P4 in the auxiliary scanning direction, two-dimensional coordinates of said marks P1, P2, P3 and P4 as detected being defined as (PX1, PY1), (PX2, PY2), (PX3, PY3) and (PX4, PY4), two-dimensional coordinates of positions Q1, Q2, Q3 and Q4, which represent designed positions of said four marks P1, P2, P3 and P4, being (QX1, QY1), (QX2, QY2), (QX3, QY3) and (QX4, QY4), the scaling factors, T1 and TN, of said scanning sections located at the sides of said quadrilateral being expressed as:

$$T1=(PY2-PY1)/(QY2-QY1); \text{ and}$$

$$TN=(PY4-PY3)/(QY4-QY3).$$

7. The laser imaging apparatus according to claim 1, further comprising a first table that mounts a member, a surface of the member being the surface to be scanned, wherein said rotator includes a second table that mounts said first table, said first table rotating as said second table rotates, and wherein said mover includes a third table that mounts said second table, said first and second table moving in the auxiliary scanning direction as said third table moves in the auxiliary scanning direction.

8. The laser, imaging apparatus according to claim 1, wherein the auxiliary scanning direction is perpendicular to the main scanning direction.

9. The laser imaging apparatus according to claim 1, wherein said detector includes:

at least one camera system fixed with respect to said laser imaging apparatus, said at least one camera capturing an image of said plurality of position marks; and an image processing system that processes the image captured by said at least one camera and determines two-dimensional coordinates of said plurality of position marks.

10. The laser imaging apparatus according to claim 1, wherein said scanning unit emits a plurality of laser beams parallel to each other, and aligned in the auxiliary scanning direction.

* * * * *